United States Patent
Zhodzishsky et al.

(10) Patent No.: US 9,584,308 B2
(45) Date of Patent: Feb. 28, 2017

(54) DIGITAL SYSTEM FOR ESTIMATING SIGNAL NON-ENERGY PARAMETERS USING A DIGITAL PHASE LOCKED LOOP

(71) Applicant: Topcon Positioning Systems, Inc., Livermore, CA (US)

(72) Inventors: Mark I. Zhodzishsky, Moscow (RU); Victor A. Prasolov, Moscow (RU); Dmitry M. Zhodzishsky, Moscow (RU)

(73) Assignee: Topcon Positioning Systems, Inc., Livermore, CA (US)

(*) Notice: Subject to any disclaimer, the term of this patent is extended or adjusted under 35 U.S.C. 154(b) by 34 days.

(21) Appl. No.: 14/654,905

(22) PCT Filed: Jan. 26, 2015

(86) PCT No.: PCT/RU2015/000043
§ 371 (c)(1),
(2) Date: Jun. 23, 2015

(87) PCT Pub. No.: WO2016/122341
PCT Pub. Date: Aug. 4, 2016

(65) Prior Publication Data
US 2016/0315759 A1    Oct. 27, 2016

(51) Int. Cl.
*H04L 7/033*     (2006.01)
*H03L 7/08*      (2006.01)
*H03L 7/085*     (2006.01)

(52) U.S. Cl.
CPC ............ *H04L 7/0331* (2013.01); *H03L 7/08* (2013.01); *H03L 7/085* (2013.01); *H04L 7/0332* (2013.01)

(58) Field of Classification Search
CPC ................................. H04L 7/0331; H03L 7/08
See application file for complete search history.

(56) References Cited

U.S. PATENT DOCUMENTS

| 4,771,250 A | 9/1988 | Statman et al. |
| 8,271,221 B2 | 9/2012 | Sato |
| 8,891,687 B1 * | 11/2014 | Zhodzishsky .......... H04B 17/00 375/327 |

OTHER PUBLICATIONS

Search Report in PCT/RU/2015/000043, dated Nov. 12, 2015.

* cited by examiner

*Primary Examiner* — Jean B Corrielus
(74) *Attorney, Agent, or Firm* — Bardmesser Law Group

(57) ABSTRACT

A digital system of measuring parameters of the signal (phase, frequency and frequency derivative) received in additive mixture with Gaussian noise. The system is based on the use of variables of a PLL for calculating preliminary estimates of parameters and calculating the corrections for these estimates when there is a spurt frequency caused by a receiver motion with a jerk. A jerk is determined if the low pass filtered signal of the discriminator exceeds a certain threshold. The jerk-correction decreases the dynamic errors. Another embodiment includes a tracking filter for obtaining preliminary estimates of parameters to reduce the fluctuation errors. Estimates are taken from the tracking filter when there is no jerk and from the block of jerk-corrections when there is a jerk.

19 Claims, 2 Drawing Sheets

DIGITAL SYSTEM FOR ESTIMATING SIGNAL NON-ENERGY PARAMETERS USING A DIGITAL PHASE LOCKED LOOP

BACKGROUND OF THE INVENTION

Phase, frequency and frequency derivative are parameters independent of energy of the input signal (i.e., non-energy parameters). There are known methods of estimating signal non-energy parameters based on processing of variables received from a phase-lock loop (PLL).

U.S. Pat. No. 7,869,554, entitled "Phase/frequency estimator-based phase locked loop", discloses an apparatus and methods described in use a PLL and provided a phase estimation of the input signal from which signal frequency is estimated by a derivative function and low pass filtering.

U.S. Pat. No. 3,895,294, entitled "Phase change measuring circuit", discloses a device for measuring the phase change of an input signal over a specified period comprising a phase-locked tracking filter including a high frequency voltage-controlled oscillator (VCO), a frequency divider to give local oscillator signal at the same frequency as the input signal and a counter counting cycles of the VCO whose phase change in any period is N times the input phase change to allow 1/N period resolution, N being an arbitrary integer. The phase change measuring circuit thus allows phase measurement with a resolution within a small fraction of one cycle.

U.S. Pat. No. 7,222,035, entitled "Method and apparatus for determining changing signal frequency", discloses a method and apparatus which include a PLL having a numerically controlled oscillator (NCO) and a filter of frequency estimates (FFE). The PLL tracks the changing signal frequency and outputs non-smoothed frequency estimates into the FFE. The FFE then smoothes noise in the signal to produce a more accurate smoothed frequency estimate of the input signal.

US Patent Publication No. 20140072084, entitled "Digital system and method of estimating quasi-harmonic signal non-energy parameters using a digital Phase Locked Loop", discloses a digital system and method of measuring (estimating) non-energy parameters of the signal (phase, frequency and frequency rate) received in additive mixture with Gaussian noise. The first embodiment of the measuring system consists of a PLL system tracking variable signal frequency, a block of NCO full phase computation (OFPC), a block of signal phase preliminary estimation (SPPE) and a first type adaptive filter filtering the signal from the output of SPPE. The second embodiment of the invention has no block SPPE, and NCO full phase is fed to the input of a second type adaptive filter.

A DPLL described in U.S. Pat. No. 4,771,250 generates signal phase which is an approximation of the phase of the received signal with a linear estimator. The effect of a complication associated with non-zero transport delays related to the DPLL is then compensated by a predictor. The estimator provides recursive estimates of phase, frequency, and higher order derivatives, while the predictor compensates for transport lag inherent in the loop.

However, the above references, as well as other conventional methods of measuring non-energy signal parameters using PLL are not adaptive to the jerking motion (when, for example, the acceleration varies linearly in time) of the receiver, or adapt to it by expanding the bandwidths of PLL or using smoothing filters. It is not possible to completely eliminate the dynamic measurement errors using conventional methods.

Unlike the methods above, the present invention enables to obtain accurate phase estimates of the input signal and its derivatives by correcting the preliminary estimates at sites with jerking motion and by an additional filtering of phase estimates at sites without such jerking motion.

The present invention can be used in receivers of various navigation systems, such as GPS, GLONASS and GALILEO, which provide precise measurements of signal phase at different rates of frequency change, as well as systems using digital PLLs for speed measurements.

SUMMARY OF THE INVENTION

Accordingly, the present invention is related to a system of estimating quasi-harmonic signal non-energy parameters using a digital Phase Locked Loop that substantially obviates one or more of the disadvantages of the related art.

In one embodiment, a system for estimating parameters of an input signal includes (a) a digital phase locked loop (PLL) that tracks the input signal and includes:
  i) a phase discriminator (PD) that determines a phase difference between the input signal and reference signals;
  ii) a loop filter (LF) with a control period $T_c$ operating based on:

$$\begin{aligned} \varphi_i^{LF} &= \alpha^{LF} \cdot z_i^d, \\ s_i^\gamma &= s_{i-1}^\gamma + \gamma^{LF} \cdot z_i^d, \\ s_i^\beta &= s_{i-1}^\beta + s_i^\gamma + \beta^{LF} \cdot z_i^d, \\ \varphi_i^r &= \text{round}(\varphi_i^{LF}/\Delta_\varphi^{NCO}), \\ f_i^r &= \text{round}(s_i^\beta/\Delta_\omega^{NCO}/T_c), \end{aligned}$$

where $\alpha^{LF}$, $\beta^{LF}$, $\gamma^{LF}$ are constants,
$z_i^d$ is a PD output;
$\varphi_i^r$ is a phase code for a Numerically Controlled Oscillator (NCO),
$f_i^r$ is a frequency code for the NCO,
$\Delta_\varphi^{NCO}$ is a phase step size in the NCO,
$\Delta_\omega^{NCO}$ is a frequency step size in the NCO, and
round(.) is an operation of numerical rounding;
  iii) the NCO having frequency and phase control using $\varphi_i^r$ and $f_i^r$,
  wherein an output of the NCO is connected to a reference input of the PD;
(b) a calculation of full phase (CFP) block that inputs $\varphi_i^r$ and $f_i^r$ and that operates based on $\varphi_i^{NCO} = \varphi_{i-1}^{NCO} + \varphi_i^r \cdot \Delta_\varphi^{NCO} + f_{i-1}^r \cdot \Delta_\omega^{NCO} \cdot T_c$; (c) a low-pass filter (LPF) inputting $z_i^d$;
  a preliminary estimation of signal parameters (PESP) block that inputs $\varphi_i^{NCO}$, $f_i^r$ and $s_i^\gamma$, outputs a preliminary estimate for a signal phase $\hat{\varphi}_i^{c,E}$ and a preliminary estimate for a signal frequency $\hat{\omega}_i^{c,E}$ based on:

$$\hat{\varphi}_i^{c,E} = \varphi_i^{NCO} + s_i^\gamma/12,$$

$$\hat{\omega}_i^{c,E} = 2\pi \cdot f_i^r - s_i^\gamma/(2 \cdot T_c);$$

(d) a jerk-corrections of preliminary estimates (JCPE) block inputting $z_i^A$, wherein the JCPE block outputs an estimate for a signal phase $\hat{\varphi}_i^c$ and an estimate for a signal frequency $\hat{\omega}_i^c$ based on:

$$\left. \begin{aligned} \hat{\varphi}_i^c &= \hat{\varphi}_i^{c,E} + z_i^A \cdot C_\varphi \\ \hat{\omega}_i^c &= \hat{\omega}_i^{c,E} + z_i^A \cdot C_\omega \end{aligned} \right\} \text{ if } z_i^A > T_A,$$

-continued $$\left.\begin{array}{l}\hat{\varphi}_i^c = \hat{\varphi}_i^{c,E}, \\ \hat{\omega}_i^c = \hat{\omega}_i^{c,E}\end{array}\right\} \text{ if } z_i^A \le T_A,$$

$C_\phi = 1 - \alpha^{LF}/2 + \beta^{LF}/12 + \gamma^{LF}/24,$ $C_\omega = (\alpha^{LF} - \beta^{LF}/2 - \gamma^{LF}/6)/T_c,$ and $T_A$ is a threshold.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

In embodiments of the present invention, adaptation to the nature of the movement of the receiver is made not by changing the parameters of FAP, but by changing the algorithm for estimating the signal parameters. For this purpose, corrections that compensate for the dynamic measurement errors during jerking motion are produced.

Figure 1:
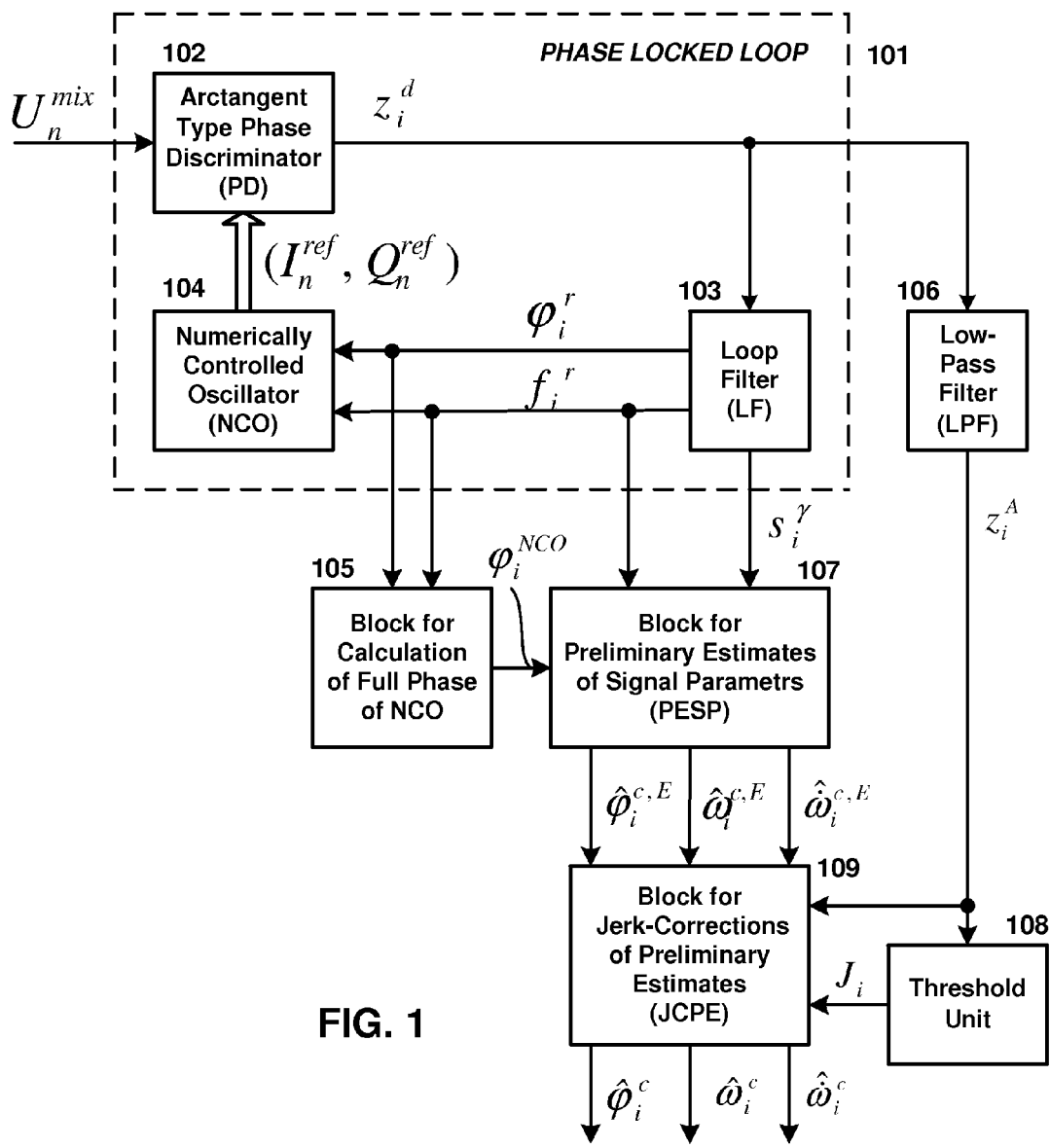
FIG. 1 is a block diagram for a first embodiment of the invention.

FIG. 1 shows a block-diagram of the first embodiment of the invention. The measuring system shown in this figure is based on the use of variables of a PLL for calculating preliminary estimates of non-energy signal parameters (i.e., phase, frequency and frequency derivative (frequency drift)) and calculating the corrections when there is a spurt frequency caused by a receiver's jerking motion. The measuring system comprises a digital PLL (101) that has the following main components: a phase discriminator (PD) (102), loop filter (LF) (103), and numerically-controlled oscillator (NCO) (103) with frequency and phase control. Samples $U_n^{mix}$ of an analog process $U^{mix}(t)$ at a sampling frequency $f_s$ are fed to the discriminator input. An analog process $U^{mix}(t) = U^c(t) + U^n(t)$ representing an additive mixture of quasi-harmonic signal $U^c(t)$ and Gaussian noise $U^n(t)$. Desired signal $U^c(t)$ is equal to $U^c(t) = A^c \cdot \cos[\phi^c(t)]$, where $A^c$ is the amplitude of the signal,
$\phi^c(t) = \int \omega^c(t) \cdot dt + \phi_0$ is the signal phase [in radians],
$\omega^c(t)$ is the signal frequency [in radian/s],
$\phi_0$ is the initial signal phase [in radian].

Signal phase $\phi^c(t)$, signal frequency $\omega^c(t)$ and frequency derivative $\dot{\omega}^c(t)$ should be estimated (measured).

A loop filter (LF) operates with a control period $T_c$ on the basis of recurrence equations:

$$\left.\begin{array}{l}\varphi_i^{LF} = \alpha^{LF} \cdot z_i^d, \\ s_i^\gamma = s_{i-1}^\gamma + \gamma^{LF} \cdot z_i^d, \\ s_i^\beta = s_{i-1}^\beta + s_i^\gamma + \beta^{LF} \cdot z_i^d, \\ \varphi_i^r = \text{round}(\varphi_i^{LF}/\Delta_\varphi^{NCO}), \\ f_i^r = \text{round}(s_i^\beta/\Delta_\omega^{NCO}/T_c),\end{array}\right\},$$

where $\alpha^{LF}, \beta^{LF}, \gamma^{LF}$ are constant transfer coefficients,
$z_i^d$ is the PD output;
$\phi_i^r$ is the phase code for NCO,
$f_i^r$ is the frequency code for NCO,
$\Delta_\varphi^{NCO}$ is the phase step size (radian) in the NCO,
$\Delta_\omega^{NCO}$ is the frequency step size (radian/s) in the NCO,
round( ) is the operation of a numerical rounding.

A numerically controlled oscillator (NCO) (104) has frequency and phase control. The phase input of the NCO is connected to the phase output $\phi_i^r$ of the loop filter (LF) and the frequency input of the NCO is connected to the frequency output $f_i^r$ of the LF (103); wherein a complex output of a NCO connected to a reference input of a PD (102).

Figure 2:
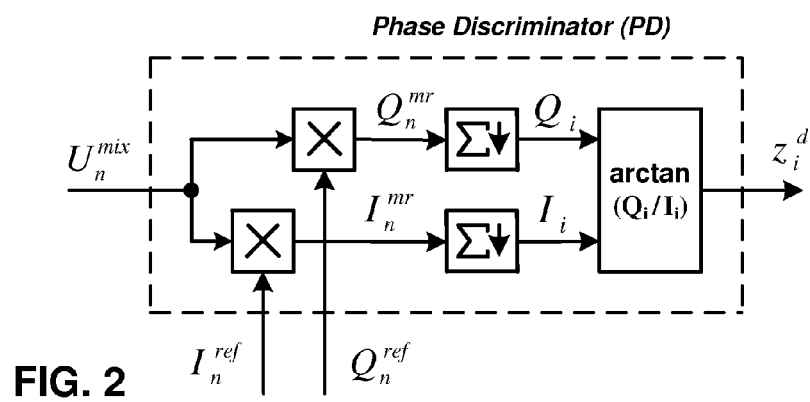
FIG. 2 is an example of an arc tangent-type phase discriminator (PD).

FIG. 2 shows an example of PD. Input samples $U_n^{mix}$ are multiplied by quadrature samples ($I_n^{ref}, Q_n^{ref}$) from the NCO, $$\left.\begin{array}{l}I_n^{ref} = A^{NCO} \cdot \cos(\varphi_n^{w,NCO}) \\ Q_n^{ref} = A^{NCO} \cdot \sin(\varphi_n^{w,NCO})\end{array}\right\},$$

where $A^{NCO}$ is the sample amplitude, and $\phi_n^{w,NCO}$ is the wrapped phase (i.e., $0 \le \phi_n^{w,NCO} < +2\pi$) of NCO in radians. Multiplication results $$\left.\begin{array}{l}I_n^{mr} = U_n^{mix} \cdot I_n^{ref} \\ Q_n^{mr} = U_n^{mix} \cdot Q_n^{ref}\end{array}\right\}$$

are fed to the input of low-pass filters, which are typically the reset accumulators $\Sigma\downarrow$ with frequency $F_c \ll f_s$. The reset frequency of the accumulators $F_c$ is the control frequency in the PLL, for example, $F_c$=50 Hz . . . 1000 Hz; $f_s$= 10 MHz . . . 100 MHz. The outputs of the reset accumulators are $$I_i = \sum_{m=1}^{m=N_s} I_{m+(i-1) \cdot N_s}^{mr} \text{ and } Q_i = \sum_{m=1}^{m=N_s} Q_{m+(i-1) \cdot N_s}^{mr}.$$

The output of a phase discriminator is $z_i^d = \arctan(Q_i/I_i)$ [in radians].

Further, the signal $z_i^d$ from the PD output is inputted to the loop filter (LF) (FIG. 2), which operates with a control period $T_c = N_s/f_s$ on the basis of recurrence equation:

$$\left.\begin{array}{l}\varphi_i^{LF} = \alpha^{LF} \cdot z_i^d, \\ s_i^\gamma = s_{i-1}^\gamma + \gamma^{LF} \cdot z_i^d, \\ s_i^\beta = s_{i-1}^\beta + s_i^\gamma + \beta^{LF} \cdot z_i^d, \\ \varphi_i^r = \text{round}(\varphi^{LF}/\Delta_\varphi^{NCO}), \\ f_i^r = \text{round}(s_i^\beta/\Delta_\omega^{NCO}/T_c),\end{array}\right\}$$

where $\alpha^{LF}$, $\beta^{LF}$, $\gamma^{LF}$ are constant transfer coefficients,
$z_i^d$ is the PD output;
$\varphi_i^r$ is the phase code for the NCO,
$f_i^r$ is the frequency code for the NCO,
$\Delta_\varphi^{NCO}$ is the phase step size (radian) in the NCO,
$\Delta_\omega^{NCO}$ is the frequency step size (radian/s) in the NCO, and
round(.) is the operation of a numerical rounding.

Digital phase samples $\varphi_i^r$ are fed to the NCO phase control input and abruptly change its phase by the corresponding value $\Delta\varphi_i^{NCO} = \varphi_i^r \cdot \Delta_\varphi^{NCO}$, where $\Delta_\varphi^{NCO}$ is the phase step size. Samples $f_i^r$ (frequency codes) are delivered to the NCO frequency input and determine its frequency $\omega_i^{ref} = f_i^r \cdot \Delta_\omega^{NCO}$, where $\Delta_\omega^{NCO}$ is the frequency step size [radian/s] in the NCO.

The measuring system (see FIG. 1) comprises also:

block (105) for calculation of full phase (CFP) of NCO, coupled with the LF outputs, operates on the basis of equation $$\varphi_i^{NCO} = \varphi_{i-1}^{NCO} + \varphi_i^r \cdot \Delta_\varphi^{NCO} + f_{i-1}^r \cdot \Delta_\omega^{NCO} \cdot T_c;$$

block (106)—a low-pass filter (LPF) coupled with an output $z_i^d$ of a PD;

block (107)—a block for preliminary estimation of signal parameters (PESP) coupled by its inputs with:
the phase output $\varphi_i^{NCO}$ of a block for CFP of a NCO,
the frequency output $f_i^r$ of the loop filter,
the output $s_i^\gamma$ of the loop filter;
where a block for PESP operates on the basis of equations:

$$\hat{\varphi}_i^{c,E} = \varphi_i^{NCO} + s_i^\gamma/12,$$

$$\hat{\omega}_i^{c,E} = 2\pi \cdot f_i^r - s_i^\gamma/(2 \cdot T_c),$$

$$\hat{\dot{\omega}}_i^{c,E} = s_i^\gamma/T_c^2;$$

where
$\hat{\varphi}_i^{c,E}$ is the preliminary estimate for a signal phase [in radians],
$\hat{\omega}_i^{c,E}$ is the preliminary estimate for a signal frequency [radian/s],
$\hat{\dot{\omega}}_i^{c,E}$ is the preliminary estimate for a signal frequency derivative [radian/s²];

block (108) is a threshold unit coupled with an output $z_i^A$ of a LPF; where an output $J_i$ of a threshold unit is given by the formula:

$$J_i = \text{true, if } z_i^A > T_A,$$

$$J_i = \text{false, if } z_i^A \leq T_A,$$

here $T_A$ is a threshold; the threshold value is set equal to $(3 \ldots 5) \cdot \text{RMS}(z_i^A)$.

block (109)—a block for jerk-corrections of preliminary estimates (JCPE) coupled with an output $z_i^A$ of a LPF and with an output $J_i$ of a threshold unit; where the block JCPE operates on the basis of equations:

$$\left.\begin{array}{l}\hat{\varphi}_i^c = \hat{\varphi}_i^{c,E} + z_i^A \cdot C_\varphi \\ \hat{\omega}_i^c = \hat{\omega}_i^{c,E} + z_i^A \cdot C_\omega \\ \hat{\dot{\omega}}_i^c = \hat{\dot{\omega}}_i^{c,E} + z_i^A \cdot C_{\dot{\omega}}\end{array}\right\}$$

if $J_i = \text{true}$, $$\left.\begin{array}{l}\hat{\varphi}_i^c = \hat{\varphi}_i^{c,E}, \\ \hat{\omega}_i^c = \hat{\omega}_i^{c,E} \\ \hat{\dot{\omega}}_i^c = \hat{\dot{\omega}}_i^{c,E}\end{array}\right\}$$

if $J_i = \text{false}$, where
$\hat{\varphi}_i^c$ is the estimate for a signal phase [in radians],
$\hat{\omega}_i^c$ is the estimate for a signal frequency [in radian/s],
$\hat{\dot{\omega}}_i^c$ is the estimate for a signal frequency derivative [in radian/s²], $$C_\varphi = 1 - \alpha^{LF}/2 + \beta^{LF}/12 + \gamma^{LF}/24,$$

$$C_\omega = (\alpha^{LF} - \beta^{LF}/2 - \gamma^{LF}/6)T_c,$$

$$C_{\dot{\omega}} = \beta^{LF}/T_c^2.$$

Figure 3:
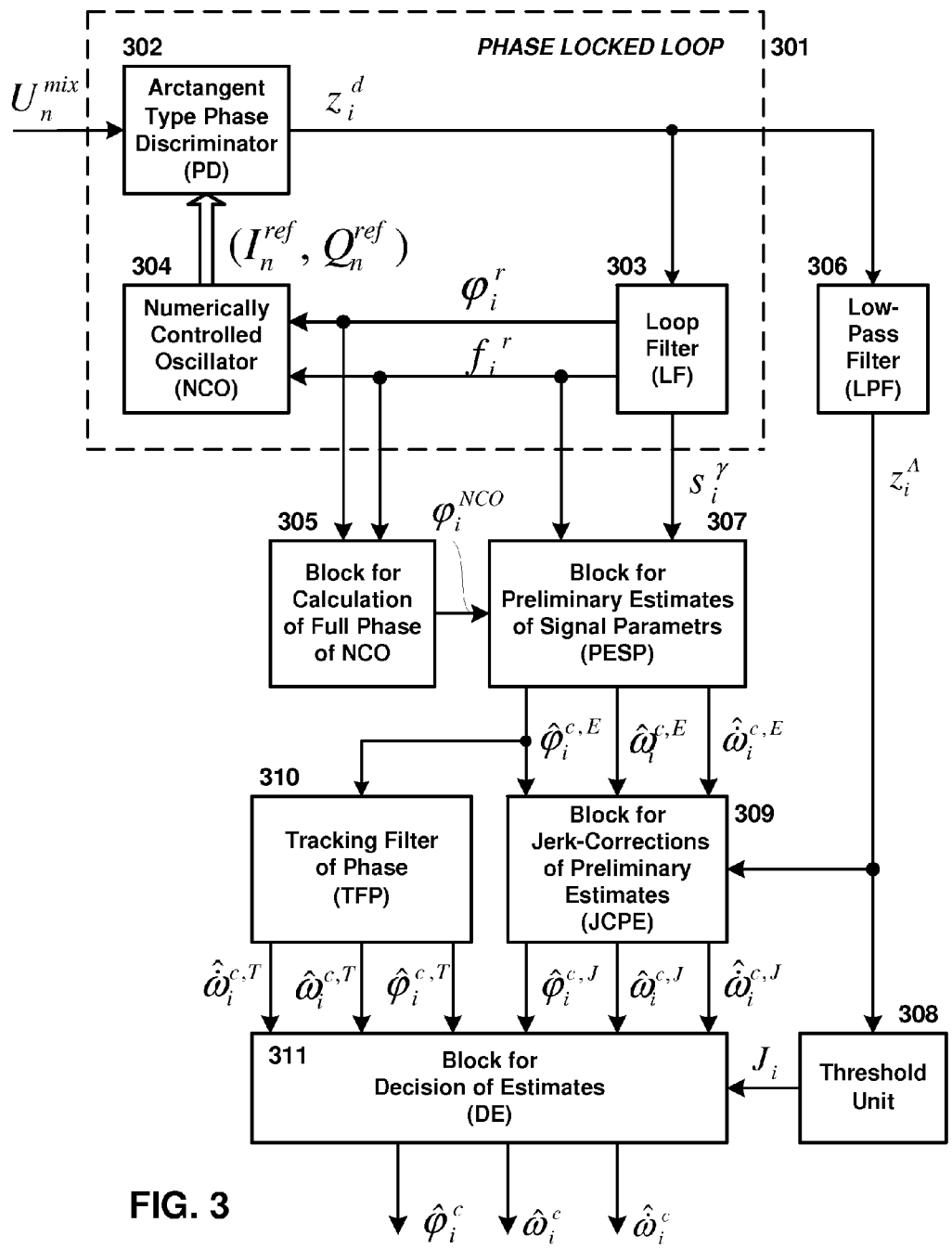
FIG. 3 is a block diagram for a second embodiment of the invention.

FIG. 3 shows a block-diagram of the second embodiment of the invention. The measuring system is based on the use of variables of a PLL for calculating preliminary estimates of signal parameters (phase, frequency and frequency derivative) and calculating the corrections when there is a spurt frequency caused by a receiver jerking motion. When a frequency spurt is absent, the parameter estimates are obtained by 3rd order tracking filter, whose input is fed by a preliminary assessment of phase. The measuring system FIG. 3 comprises blocks (301), (302), (303), (304), (305), (306), (307), (308), (309). All of these blocks and their connection are the same as in the first embodiment respectively (101), (102), (103), (104), (105), (106), (107), (108), (109), except that the output of unit (308) does not feed unit (309).

Block (309) for jerk-corrections of preliminary estimates (JCPE) coupled with an output $z_i^A$ of a LPF and operates on the basis of equations:

$$\left.\begin{array}{l}\hat{\varphi}_i^{c,J} = \hat{\varphi}_i^{c,E} + z_i^A \cdot C_\varphi, \\ \hat{\omega}_i^{c,J} = \hat{\omega}_i^{c,E} + z_i^A \cdot C_\omega \\ \hat{\dot{\omega}}_i^{c,J} = \hat{\dot{\omega}}_i^{c,E} + z_i^A \cdot C_{\dot{\omega}}\end{array}\right\},$$

where $\hat{\varphi}_i^{c,J}$, $\hat{\omega}_i^{c,J}$, $\hat{\dot{\omega}}_i^{c,J}$ are, respectively, estimates with jerk-corrections for a phase [in radians], frequency [in radian/s] and frequency derivative [radian/s²] of a signal.

Block (309) for jerk-corrections of preliminary estimates (JCPE) reduces dynamic error of estimates due to frequency spurts, but it increases fluctuation errors of estimates. The measuring system, see FIG. 3, comprises a 3rd order tracking filter of phase (TFP) (310) to reduce the fluctuation errors in the absence of frequency spurt; wherein a TFP bandwidth is less than a PLL bandwidth. Block TFP (310) coupled with the outputs $\hat{\varphi}_i^{c,E}$ of the PESP, operates on the basis of recurrence equations:

$$\left.\begin{array}{l}\overline{\varphi}_i^{c,T} = \hat{\varphi}_{i-1}^{c,T} + \hat{\omega}_{i-1}^{c,T} \cdot T_c + \hat{\dot{\omega}}_{i-1}^{c,T} \cdot T_c^2/2 \\ \overline{\omega}_i^{c,T} = \hat{\omega}_{i-1}^{c,T} + \hat{\dot{\omega}}_{i-1}^{c,T} \cdot T_c \\ \overline{\dot{\omega}}_i^c = \hat{\dot{\omega}}_{i-1}^{c,T} \end{array}\right\}$$

$$z_i^T = \phi_i^{NCO} - \overline{\phi}_i^{c,T},$$

$$\left.\begin{array}{l}\hat{\varphi}_i^{c,T} = \overline{\varphi}_i^{c,T} + \alpha^T \cdot z_i^T \\ \hat{\omega}_i^{c,T} = \overline{\omega}_i^{c,T} + \beta^T \cdot z_i^T/T_c \\ \hat{\dot{\omega}}_i^{c,T} = \overline{\dot{\omega}}_i^{c,T} + \gamma^T \cdot z_i^T/T_c^2 \end{array}\right\},$$

where $\alpha^T$, $\beta^T$, $\gamma^T$ are constant transfer coefficients of the TFP.

Block (311) decides on which group of estimates for signal parameters should be taken; this block takes the estimates from the TFP block when there is no jerk, otherwise, it takes the estimates from the JCPE (when there is jerk), i.e.

$$\left.\begin{array}{l}\hat{\varphi}_i^c = \hat{\varphi}_i^{c,T} \\ \hat{\omega}_i^c = \hat{\omega}_i^{c,T} \\ \hat{\dot{\omega}}_i^c = \hat{\dot{\omega}}_i^{c,T} \end{array}\right\}$$

if $J_i$ = false, $$\left.\begin{array}{l}\hat{\varphi}_i^c = \hat{\varphi}_i^{c,J} \\ \hat{\omega}_i^c = \hat{\omega}_i^{c,J} \\ \hat{\dot{\omega}}_i^c = \hat{\dot{\omega}}_i^{c,J} \end{array}\right\}$$

if $J_i$ = true;

where
$\hat{\varphi}_i^c$ is the estimate for a signal phase [in radians],
$\hat{\omega}_i^c$ is the estimate for a signal frequency [in radian/s],
$\hat{\dot{\omega}}_i^c$ is the estimate for a signal frequency derivative [in radian/s$^2$].

Figure 4:
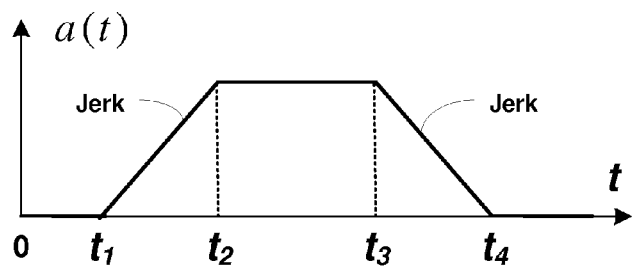
FIG. 4 illustrates a jerk as a function of time.

FIG. 4 shows an example of motion with jerks. This jerking motion consists of: $0 < t \leq t_1$ and $t > t_4$ are states without movement, $t_1 < t \leq t_2$ and $t_3 < t \leq t_4$ are states with jerks, when the acceleration varies linearly, $t_2 < t \leq t_3$ is the state with a constant acceleration.

Having thus described a preferred embodiment, it should be apparent to those skilled in the art that certain advantages of the described apparatus have been achieved.

It should also be appreciated that various modifications, adaptations, and alternative embodiments thereof may be made within the scope and spirit of the present invention. The invention is further defined by the following claims.

What is claimed is:

1. A system for estimating non-energy parameters of an input signal, the system comprising:
  a) a third order digital phase locked loop (PLL) that tracks the input signal and includes:
    i) a phase discriminator (PD) that determines a phase difference between the input signal and reference signals;
    ii) a loop filter (LF) with a control period $T_c$ operating based on equations:

$$\left.\begin{array}{l}\varphi_i^{LF} = \alpha^{LF} \cdot z_i^d, \\ s_i^\gamma = s_{i-1}^\gamma + \gamma^{LF} \cdot z_i^d, \\ s_i^\beta = s_{i-1}^\beta + s_i^\gamma + \beta^{LF} \cdot z_i^d, \\ \varphi_i^r = \text{round}(\varphi_i^{LF}/\Delta_\varphi^{NCO}), \\ f_i^r = \text{round}(s_i^\beta/\Delta_\omega^{NCO}/T_c), \end{array}\right\},$$

where $\alpha^{LF}$, $\beta^{LF}$, $\gamma^{LF}$ are constant transfer coefficients,
$z_i^d$ is a PD output;
$\phi_i^r$ is a phase code for a Numerically Controlled Oscillator (NCO),
$f_i^r$ is a frequency code for the NCO,
$\Delta_\phi^{NCO}$ is a phase step size in the NCO,
$\Delta_\omega^{NCO}$ is a frequency step size in the NCO,
$s_i^\beta$ is an output of the LF representing a signal that is proportional to a frequency of the input signal;
$s_i^\gamma$ is an output of the LF representing a signal that is proportional to a rate of change of the frequency of the input signal;
$\phi_i^{LF}$ is an output of the LF representing a signal used to control a phase of the NCO; and
round(.) is an operation of numerical rounding;
    iii) the NCO having frequency and phase control, and whose phase input is connected to the phase output $\phi_i^r$ and whose frequency input is connected to the frequency code $f_i^r$, wherein a complex output of the NCO is connected to a reference input of the PD;
  b) wherein the system is implemented in a receiver, and wherein the receiver is configured to calculate a full phase of the NCO, using the LF outputs $\phi_i^r$ and $f_i^r$ and operating based on equation $$\phi_i^{NCO} = \phi_{i-1}^{NCO} + \phi_i^r \cdot \Delta_\phi^{NCO} + f_{i-1}^r \cdot \Delta_\omega^{NCO} \cdot T_c;$$

c) a low-pass filter (LPF) inputting the output $z_i^d$ of the PD and outputting $z_i^A$;
  d) wherein the receiver is further configured to generate a preliminary estimation of signal parameters using:
    the full phase $\phi_i^{NCO}$,
    the frequency code $f_i^r$, and
    the output $s_i^\gamma$ t of the LF,
    wherein the preliminary estimation of signal parameters are based on:

$$\hat{\phi}_i^{c,E} = \phi_i^{NCO} + s_i^\gamma/12,$$

$$\hat{\omega}_i^{c,E} = f_i^r \cdot \Delta_\omega^{NCO} - s_i^\gamma/(2 \cdot T_c),$$

$$\hat{\dot{\omega}}_i^{c,E} = s_i^\gamma/T_c^2;$$

where
  $\hat{\phi}_i^{c,E}$ is a preliminary estimate for a signal phase,
  $\hat{\omega}_i^{c,E}$ is a preliminary estimate for a signal frequency,
  $\hat{\dot{\omega}}_i^{c,E}$ is a preliminary estimate for a signal frequency derivative;
  e) wherein the receiver is further configured to generate an output $J_i$ based on the output $z_i^A$ of the LPF as follows $$J_i = \text{true, if } z_i^A > T_A,$$

$$J_i = \text{false, if } z_i^A \leq T_A,$$

where $T_A$ is a threshold;
  f) wherein the receiver is further configured to jerk-correct the preliminary estimates by using the output $z_i^A$ of the LPF and the output $J_i$ according to:

$$\left.\begin{aligned}\hat{\varphi}_i^c &= \hat{\varphi}_i^{c,E} + z_i^A \cdot C_\varphi \\ \hat{\omega}_i^c &= \hat{\omega}_i^{c,E} + z_i^A \cdot C_\omega \\ \hat{\dot{\omega}}_i^c &= \hat{\dot{\omega}}_i^{c,E} + z_i^A \cdot C_{\dot\omega}\end{aligned}\right\}$$

if $J_i$ = true, $$\left.\begin{aligned}\hat{\varphi}_i^c &= \hat{\varphi}_i^{c,E}, \\ \hat{\omega}_i^c &= \hat{\omega}_i^{c,E} \\ \hat{\dot{\omega}}_i^c &= \hat{\dot{\omega}}_i^{c,E}\end{aligned}\right\}$$

if $J_i$ = false, where $\hat{\varphi}_i^c$ is an estimate for a signal phase,
$\hat{\omega}_i^c$ is an estimate for a signal frequency,
$\hat{\dot{\omega}}_i^c$ is an estimate for a signal frequency derivative, $C_\varphi = 1 - \alpha^{LF}/2 + \beta^{LF}/12 + \gamma^{LF}/24$, $C_\omega = (\alpha^{LF} - \beta^{LF}/2 - \gamma^{LF}/6)/T_c$, $C_{\dot\omega} = \beta^{LF}/T_c^2$.

2. The system of claim 1, wherein the LPF operates based on $z_i^A = z_{i-1}^A + \alpha^{LPF} \cdot (z_i^d - z_{i-1}^A)$, where $\alpha^{LPF}$ is a constant transfer coefficient, $0 < \alpha^{LPF} < 1$.

3. The system of claim 1, wherein the LPF operates based on $z_i^A = z_{i-1}^A + \alpha^{LPF} \cdot (z_i^d - z_{i-1}^A)$, where $0 < \alpha^{LPF} < 1$.

4. A system for estimating non-energy parameters of an input signal, the system comprising:
a) a third order digital phase locked loop (PLL) that tracks the input signal and includes:
  (i) a phase discriminator (PD) that determines a phase difference between the input signal and reference signals;
  (ii) a loop filter (LF) with a control period $T_c$ based on equations:

$$\left.\begin{aligned}\varphi_i^{LF} &= \alpha^{LF} \cdot z_i^d, \\ s_i^\gamma &= s_{i-1}^\gamma + \gamma^{LF} \cdot z_i^d, \\ s_i^\beta &= s_{i-1}^\beta + s_i^\gamma + \beta^{LF} \cdot z_i^d, \\ \varphi_i^r &= \text{round}(\varphi_i^{LF}/\Delta_\varphi^{NCO}), \\ f_i^r &= \text{round}(s_i^\beta/\Delta_\omega^{NCO}/T_c),\end{aligned}\right\},$$

where $\alpha^{LF}$, $\beta^{LF}$, $\gamma^{LF}$ are constant transfer coefficients,
$z_i^d$ is a PD output;
$\varphi_i^r$ is a phase code for a numerically controlled oscillator (NCO),
$f_i^r$ is a frequency code for the NCO,
$\Delta_\varphi^{NCO}$ is a phase step size in the NCO,
$\Delta_\omega^{NCO}$ is a frequency step size in the NCO,
$s_i^\beta$ is an output of the LF representing a signal that is proportional to a frequency of the input signal;
$s_i^\gamma$ is an output of the LF representing a signal that is proportional to a rate of change of the frequency of the input signal;

$\varphi_i^{LF}$ is an output of the LF representing a signal used to control a phase of the NCO;
round(.) is an operation of a numerical rounding; and
  (iii) the NCO having frequency and phase control, whose phase input is connected to the phase output $\varphi_i^r$ and a frequency input is connected to the frequency code $f_i^r$, wherein a complex output of the NCO is connected to a reference input of the PD;
b) wherein the system is implemented in a receiver, and wherein the receiver is configured to calculate a full phase of the NCO, based on the LF outputs $\varphi_i^r$ and $f_i^r$, and operating based on equation $\varphi_i^{NCO} = \varphi_{i-1}^{NCO} + \varphi_i^r \cdot \Delta_\varphi^{NCO} + f_{i-1}^r \cdot \Delta_\omega^{NCO} \cdot T_c$;

c) a low-pass filter (LPF) inputting the output $z_i^d$ from the PD and outputting $z_i^A$;
d) wherein the receiver is configured to generate preliminary estimates of signal parameters based on the full phase output $\varphi_i^{NCO}$, the frequency code $f_i^r$, and the output $s_i^\gamma$ according to equations:

$$\left.\begin{aligned}\hat{\varphi}_i^{c,E} &= \varphi_i^{NCO} + s_i^\gamma/12 \\ \hat{\omega}_i^{c,E} &= f_i^r \cdot \Delta_\omega^{NCO} - s_i^\gamma/(2 \cdot T_c) \\ \hat{\dot{\omega}}_i^{c,E} &= s_i^\gamma/T_c^2\end{aligned}\right\}$$

where $\hat{\varphi}_i^{c,E}$ is a preliminary estimate for a signal phase,
$\hat{\omega}_i^{c,E}$ is a preliminary estimate for a signal frequency,
$\hat{\dot{\omega}}_i^{c,E}$ is a preliminary estimate for a signal frequency derivative;

e) wherein the receiver is further configured to generate an output $J_i$ based on the output $z_i^A$ of the LPF as follows:

$J_i$ = true, if $z_i^A > T_A$, $J_i$ = false, if $z_i^A \leq T_A$, where $T_A$ is a threshold;
f) wherein the receiver is further configured to perform jerk-corrections of the preliminary estimates based on equations:

$$\left.\begin{aligned}\hat{\varphi}_i^{c,J} &= \hat{\varphi}_i^{c,E} + z_i^A \cdot C_\varphi, \\ \hat{\omega}_i^{c,J} &= \hat{\omega}_i^{c,E} + z_i^A \cdot C_\omega \\ \hat{\dot{\omega}}_i^{c,J} &= \hat{\dot{\omega}}_i^{c,E} + z_i^A \cdot C_{\dot\omega}\end{aligned}\right\}$$

where $\hat{\varphi}_i^{c,J}$, $\hat{\omega}_i^{c,J}$, $\hat{\dot{\omega}}_i^{c,J}$ are, respectively, estimates with jerk-corrections for a phase, frequency and frequency derivative of the input signal, $C_\varphi = 1 - \alpha^{LF}/2 + \beta^{LF}/12 \pm \gamma^{LF}/24$, $C_\omega = (\alpha^{LF} - \beta^{LF}/2 - \gamma^{LF}/6)/T_c$, $C_{\dot\omega} = \beta^{LF}/T_c^2$;

g) a third order tracking filter of phase (TFP) which operates based on equations:

$$\left.\begin{aligned}\bar{\varphi}_i^{c,T} &= \hat{\varphi}_{i-1}^{c,T} + \hat{\omega}_{i-1}^{c,T} \cdot T_c + \hat{\dot{\omega}}_{i-1}^{c,T} \cdot T_c^2/2 \\ \bar{\omega}_i^{c,T} &= \hat{\omega}_{i-1}^{c,T} + \hat{\dot{\omega}}_{i-1}^{c,T} \cdot T_c \\ \bar{\dot{\omega}}_i^c &= \hat{\dot{\omega}}_{i-1}^{c,T}\end{aligned}\right\}$$

$z_i^T = \varphi_i^{NCO} - \bar{\varphi}_i^{c,T}$, $$\left.\begin{array}{l}\hat{\varphi}_i^{c,T} = \overline{\varphi}_i^{c,T} + \alpha^T \cdot z_i^T \\ \hat{\omega}_i^{c,T} = \overline{\omega}_i^{c,T} + \beta^T \cdot z_i^T / T_c \\ \hat{\dot{\omega}}_i^{c,T} = \overline{\dot{\omega}}_i^{c,T} + \gamma^T \cdot z_i^T / T_c^2 \end{array}\right\},$$

where $\alpha^T, \beta^T, \gamma^T$ are constant transfer coefficients of the TFP;

h) wherein the receiver is further configured to output the estimates from the TFP as the estimates of signal parameters when there is no jerk and takes the preliminary estimates otherwise, such that $$\left.\begin{array}{l}\hat{\varphi}_i^c = \hat{\varphi}_i^{c,T} \\ \hat{\omega}_i^c = \hat{\omega}_i^{c,T} \\ \hat{\dot{\omega}}_i^c = \hat{\dot{\omega}}_i^{c,T}\end{array}\right\}$$

if $J_i$ = false, $$\left.\begin{array}{l}\hat{\varphi}_i^c = \hat{\varphi}_i^{c,J} \\ \hat{\omega}_i^c = \hat{\omega}_i^{c,J} \\ \hat{\dot{\omega}}_i^c = \hat{\dot{\omega}}_i^{c,J}\end{array}\right\}$$

if $J_i$ = true;

where
$\hat{\varphi}_i^c$ is an estimate for a signal phase,
$\hat{\omega}_i^c$ is an estimate for a signal frequency, and
$\hat{\dot{\omega}}_i^c$ is an estimate for a signal frequency derivative.

5. The system of claim 4, wherein the low-pass filter (LPF) is based on equation $$z_i^A = z_{i-1}^A + \alpha^{LPF} \cdot (z_i^d - z_{i-1}^A),$$

where $\alpha^{LPF}$ is a constant transfer coefficient, $0 < \alpha^{LPF} < 1$.

6. A system for estimating parameters of an input signal, the system comprising:
(a) a digital phase locked loop (PLL) that tracks the input signal and includes:
  (i) a phase discriminator (PD) that determines a phase difference between the input signal and reference signals;
  (ii) a loop filter (LF) with a control period $T_c$ operating based on:

$$\left.\begin{array}{l}\varphi_i^{LF} = \alpha^{LF} \cdot z_i^d, \\ s_i^\gamma = s_{i-1}^\gamma + \gamma^{LF} \cdot z_i^d, \\ s_i^\beta = s_{i-1}^\beta + s_i^\gamma + \beta^{LF} \cdot z_i^d, \\ \varphi_i^r = \text{round}(\varphi_i^{LF} / \Delta_\varphi^{NCO}), \\ f_i^r = \text{round}(s_i^\beta / \Delta_\omega^{NCO} / T_c), \end{array}\right\},$$

where $\alpha^{LF}, \beta^{LF}, \gamma^{LF}$ are constants,
$z_i^d$ is a PD output;
$\varphi_i^r$ is a phase code for a Numerically Controlled Oscillator (NCO),
$f_i^r$ is a frequency code for the NCO,
$\Delta_\varphi^{NCO}$ is a phase step size in the NCO,
$\Delta_\omega^{NCO}$ is a frequency step size in the NCO,
$s_i^\beta$ is an output of the LF representing a signal that is proportional to a frequency of the input signal;
$s_i^\gamma$ is an output of the LF representing a signal that is proportional to a rate of change of the frequency of the input signal;
$\varphi_i^{LF}$ is an output of the LF representing a signal used to control a phase of the NCO; and
round(.) is an operation of numerical rounding;
  (iii) the NCO having frequency and phase control using $\varphi_i^r$ and $f_i^r$, wherein an output of the NCO is connected to a reference input of the PD;
(b) wherein the system is implemented in a receiver, and wherein the receiver is configured to calculate a full phase based on $\varphi_i^r$ and $f_i^r$ from the LF and based on $$\varphi_i^{NCO} = \varphi_{i-1}^{NCO} + \varphi_i^r \cdot \Delta_\varphi^{NCO} + f_{i-1}^r \cdot \Delta_\omega^{NCO} \cdot T_c;$$

(c) a low-pass filter (LPF) inputting $z_i^d$ and outputting $z_i^A$;
(d) wherein the receiver is further configured to generate a preliminary estimate for a signal phase $\hat{\varphi}_i^{c,E}$ and a preliminary estimate for a signal frequency $\hat{\omega}_i^{c,E}$ based on:

$$\hat{\varphi}_i^{c,E} = \varphi_i^{NCO} + s_i^\gamma / 12,$$

$$\hat{\omega}_i^{c,E} = f_i^r \cdot \Delta_\omega^{NCO} - s_i^\gamma / (2 \cdot T_c);$$

(e) wherein the receiver is further configured to perform jerk-corrections of the preliminary estimates and to output an estimate for a signal phase $\hat{\varphi}_i^c$ and an estimate for a signal frequency $\hat{\omega}_i^c$ based on:

$$\left.\begin{array}{l}\hat{\varphi}_i^c = \hat{\varphi}_i^{c,E} + z_i^A \cdot C_\varphi \\ \hat{\omega}_i^c = \hat{\omega}_i^{c,E} + z_i^A \cdot C_\omega\end{array}\right\}$$

if $$z_i^A > T_A,$$

$$\left.\begin{array}{l}\hat{\varphi}_i^c = \hat{\varphi}_i^{c,E}, \\ \hat{\omega}_i^c = \hat{\omega}_i^{c,E}\end{array}\right\}$$

if $$z_i^A \leq T_A,$$

where
$$C_\varphi = 1 - \alpha^{LF}/2 + \beta^{LF}/12 + \gamma^{LF}/24,$$

$$C_\omega = (\alpha^{LF} - \beta^{LF}/2 - \gamma^{LF}/6) T_c, \text{ and}$$

$T_A$ is a threshold.

7. The system of claim 6, wherein the PD is an arctangent-type PD.

8. The system of claim 6, wherein the PLL is a third order PLL.

9. The system of claim 6, wherein the system also estimates a signal frequency derivative $\hat{\dot{\omega}}_i^c$ as follows:
the receiver is configured to generate a preliminary estimate for a signal frequency derivative $\hat{\dot{\omega}}_i^{c,E} = s_i^\gamma / T_c^2$; and
the receiver is configured to output $$\hat{\dot{\omega}}_i^c = \hat{\dot{\omega}}_i^{c,E} + z_i^A \cdot C_{\dot{\omega}}, \text{ if } z_i^A > T_A,$$

$$\hat{\dot{\omega}}_i^c = \hat{\dot{\omega}}_i^{c,E}, \text{ if } z_i^A \leq T_A,$$

where $C_{\dot{\omega}} = \beta^{LF}/T_c^2$.

10. The system of claim 6, where $\alpha^{LF}, \beta^{LF}, \gamma^{LF}$ are constant transfer coefficients.

11. A system for estimating non-energy parameters of an input signal, the system comprising:
a) a digital phase locked loop (PLL) that includes:
   i) a phase discriminator (PD) that determines a phase difference $z_i^d$ between the input signal and reference signals from a Numerically Controlled Oscillator (NCO);
   ii) a loop filter (LF) with a control period $T_c$ based on equations:

$$\begin{aligned} s_i^\gamma &= s_{i-1}^\gamma + \gamma \cdot z_i^d, \\ s_i^\beta &= s_{i-1}^\beta + s_i^\gamma + \beta \cdot z_i^d, \\ \varphi_i^r &= \text{round}(\alpha \cdot z_i^d / \Delta_\varphi^{NCO}), \\ f_i^r &= \text{round}(s_i^\beta / \Delta_\omega^{NCO} / T_c), \end{aligned}$$

where $\alpha$, $\beta$, $\gamma$ are constants,
$\phi_i^r$ is a phase control signal for the NCO,
$f_i^r$ is a frequency control signal for the NCO,
$\Delta_\phi^{NCO}$ is a phase step size in the NCO,
$\Delta_\omega^{NCO}$ is a frequency step size in the NCO,
$s_i^\beta$ corresponds to a frequency of the input signal;
$s_i^\gamma$ corresponds to a rate of change of the frequency of the input signal; and
round(.) is numerical rounding; and
   iii) the NCO inputting the $\phi_i^r$ and $f_i^r$ phase and frequency control signals;
b) wherein the system is implemented in a receiver, and wherein the receiver is configured to calculate a full phase $\phi_i^{NCO}$ based on
$\phi_i^{NCO} = \phi_{i-1}^{NCO} + \phi_i^r \cdot \Delta_\phi^{NCO} + f_{i-1}^r \cdot \Delta_\omega^{NCO} \cdot T_c$;
c) a low-pass filter (LPF) inputting the phase difference $z_i^d$ and outputting $z_i^A$;
d) wherein the receiver generates a preliminary estimation of signal parameters based on:

$\hat{\phi}_i^{c,E} = \phi_i^{NCO} + s_i^\gamma / K_\phi$, $\hat{\omega}_1^{c,E} = \Delta_\omega^{NCO} \cdot f_i^r - s_i^\gamma / (K_\omega \cdot T_c)$, $\hat{\dot{\omega}}_i^{c,E} = s_i^\gamma / T_c^2$;

where
$\hat{\phi}_i^{c,E}$ is a preliminary estimate for the phase of the input signal,
$\hat{\omega}_i^{c,E}$ is a preliminary estimate for the frequency of the input signal,
$\hat{\dot{\omega}}_i^{c,E}$ is a preliminary estimate for a derivative of the frequency of the input signal, and
$K_\phi$ and $K_\omega$ are constants;
e) wherein the receiver is further configured to generate an output $J_i$ based on $J_i$=true, if $z_i^A > T_A$, $J_i$=false, if $z_i^A \leq T_A$, where $T_A$ is a threshold; and
f) wherein the receiver is further configured to perform jerk-corrections of the preliminary estimates based on:

$$\left. \begin{aligned} \hat{\varphi}_i^c &= \hat{\varphi}_i^{c,E} + z_i^A \cdot (K_0 - \alpha/K_1 + \beta/K_2 + \gamma/K_3) \\ \hat{\omega}_i^c &= \hat{\omega}_i^{c,E} + z_i^A \cdot (\alpha - \beta/K_4 - \gamma/K_5)/T_c \\ \hat{\dot{\omega}}_i^c &= \hat{\dot{\omega}}_i^{c,E} + z_i^A \cdot \beta/T_c^2 \end{aligned} \right\} \text{if } J_i = \text{true},$$

$$\left. \begin{aligned} \hat{\varphi}_i^c &= \hat{\varphi}_i^{c,E}, \\ \hat{\omega}_i^c &= \hat{\omega}_i^{c,E} \\ \hat{\dot{\omega}}_i^c &= \hat{\dot{\omega}}_i^{c,E} \end{aligned} \right\} \text{if } J_i = \text{false},$$

where
$\hat{\phi}_i^c$ is an estimate for the phase of the input signal,
$\hat{\omega}_i^c$ is an estimate for the frequency of the input signal,
$\hat{\dot{\omega}}_i^c$ is an estimate for the derivative of the frequency of the input signal, and
$K_0$, $K_1$, $K_2$, $K_3$, $K_4$, and $K_5$ are constants.

12. The system of claim 11, where $K_0=1$, $K_1=2$, $K_2=12$, $K_3=24$, $K_4=2$ and $K_5=6$.

13. The system of claim 11, where $K_\phi=12$ and $K_\omega=2$.

14. A system for estimating parameters of an input signal, the system comprising:
a) a digital phase locked loop that includes:
   i) a phase discriminator that determines a phase difference between the input signal and reference signals from a Numerically Controlled Oscillator (NCO);
   ii) a loop filter (LF) with a control period $T_c$ that generates a phase control signal $\phi_i^r$ for the NCO and a frequency control signal $f_i^r$ for the NCO, and based on:

$$\begin{aligned} s_i^\gamma &= s_{i-1}^\gamma + \gamma \cdot z_i^d, \\ s_i^\beta &= s_{i-1}^\beta + s_i^\gamma + \beta \cdot z_i^d, \\ \varphi_i^r &= \text{round}(\alpha \cdot z_i^d / \Delta_\varphi^{NCO}), \\ f_i^r &= \text{round}(s_i^\beta / \Delta_\omega^{NCO} / T_c), \end{aligned}$$

where $\alpha$, $\beta$, $\gamma$ are constants,
$\Delta_\phi^{NCO}$ is a phase step size in the NCO,
$\Delta_\omega^{NCO}$ is a frequency step size in the NCO,
$s_i^\beta$ corresponds to a frequency of the input signal,
$s_i^\gamma$ corresponds to a rate of change of the frequency of the input signal, and
round(.) is numerical rounding; and
b) wherein the system is implemented in a receiver, and wherein the receiver is configured to calculate a full phase $\phi_i^{NCO}$ according to
$\phi_i^{NCO} = \phi_{i-1}^{NCO} + \phi_i^r \cdot \Delta_\phi^{NCO} + f_{i-1}^r \cdot \Delta_\omega^{NCO} \cdot T_c$;
c) a low-pass filter (LPF) inputting the phase difference $z_i^d$ and outputting $z_i^A$;
d) wherein the receiver uses $\phi_i^{NCO}$ and $s_i^\gamma$ for generation of:
   a preliminary estimate $\hat{\phi}_i^{c,E}$ for a phase of the input signal, and
   a preliminary estimate $\hat{\omega}_i^{c,E}$ for a frequency of the input signal;
e) wherein the receiver is configured to output a true/false value $J_i$ based on $z_i^A$; and
f) wherein the receiver is configured to perform jerk-corrections of the preliminary estimates and to generate an estimate $\hat{\phi}_i^c$ for a phase of the input signal, and an estimate $\hat{\omega}_i^c$ for the frequency of the input signal, based on $J_i$, $z_i^A$, $\hat{\phi}_i^{c,E}$ and $\hat{\omega}_i^{c,E}$.

15. The system of claim 14, wherein the receiver is also configured to generate a preliminary estimate $\hat{\dot{\omega}}_i^{c,E}$ of a derivative of the frequency of the input signal.

16. The system of claim 15, wherein the receiver is also configured to generate an estimate $\hat{\dot{\omega}}_i^c$ for the derivative of the frequency of the input signal based on $J_i$, $z_i^A$, $\hat{\phi}_i^{c,E}$, $\hat{\omega}_i^{c,E}$ and $\hat{\dot{\omega}}_i^{c,E}$.

17. The system of claim 16, wherein the preliminary estimates $\hat{\phi}_i^{c,E}$, $\hat{\omega}_i^{c,E}$, and $\hat{\dot{\omega}}_i^{c,E}$ are generated according to $$\hat{\phi}_i^{c,E} = \phi_i^{NCO} + s_i^\gamma / K_\phi,$$

$$\hat{\omega}_i^{c,E} = \Delta_\omega^{NCO} \cdot f_i^r - s_i^\gamma / (K_\omega \cdot T_c),$$

$$\hat{\dot{\omega}}_i^{c,E} = s_i^\gamma / T_c^2;$$

where $K_\phi$ and $K_\omega$ are constants.

18. The system of claim 17, wherein the receiver is also configured to generate the estimates $\hat{\phi}_i^c$, $\hat{\omega}_i^c$ and $\hat{\dot{\omega}}_i^c$ according to:

$$\left.\begin{aligned}\hat{\varphi}_i^c &= \hat{\varphi}_i^{c,E} + z_i^A \cdot (K_0 - \alpha/K_1 + \beta/K_2 + \gamma/K_3) \\ \hat{\omega}_i^c &= \hat{\omega}_i^{c,E} + z_i^A \cdot (\alpha - \beta/K_4 - \gamma/K_5)/T_c \\ \hat{\dot{\omega}}_i^c &= \hat{\dot{\omega}}_i^{c,E} + z_i^A \cdot \beta/T_c^2\end{aligned}\right\} \text{if } J_i = \text{true,}$$

$$\left.\begin{aligned}\hat{\varphi}_i^c &= \hat{\varphi}_i^{c,E} \\ \hat{\omega}_i^c &= \hat{\omega}_i^{c,E} \\ \hat{\dot{\omega}}_i^c &= \hat{\dot{\omega}}_i^{c,E}\end{aligned}\right\} \text{if } J_i = \text{false,}$$

where $K_0$, $K_1$, $K_2$, $K_3$, $K_4$, and $K_5$ are constants.

19. The system of claim 18, further comprising g) a third order tracking filter (TFP) that operates based on equations:

$$\left.\begin{aligned}\overline{\varphi}_i^{c,T} &= \hat{\varphi}_{i-1}^{c,T} + \hat{\omega}_{i-1}^{c,T} \cdot T_c + \hat{\dot{\omega}}_{i-1}^{c,T} \cdot T_c^2/2 \\ \overline{\omega}_i^{c,T} &= \hat{\omega}_{i-1}^{c,T} + \hat{\dot{\omega}}_{i-1}^{c,T} \cdot T_c \\ \overline{\dot{\omega}}_i^c &= \hat{\dot{\omega}}_{i-1}^{c,T}\end{aligned}\right\}$$

$$z_i^T = \varphi_i^{NCO} - \overline{\varphi}_i^{c,T},$$

$$\left.\begin{aligned}\hat{\varphi}_i^{c,T} &= \overline{\varphi}_i^{c,T} + \alpha^T \cdot z_i^T \\ \hat{\omega}_i^{c,T} &= \overline{\omega}_i^{c,T} + \beta^T \cdot z_i^T / T_c\end{aligned}\right\},$$

where $\alpha^T$, $\beta^T$ are constants;

wherein the receiver is also configured to output the estimates $\hat{\phi}_i^{c,T}$ and $\hat{\omega}_i^{c,T}$ from the TFP when there is no jerk and to output the estimates $\hat{\phi}_i^c$ and $\hat{\omega}_i^c$ otherwise.

* * * * *